United States Patent
Kishino

(10) Patent No.: US 6,311,250 B1
(45) Date of Patent: Oct. 30, 2001

(54) COMPUTER MEMORY CONTROLLER WITH SELF REFRESH PERFORMED DURING MEMORY BACK-UP OPERATION IN CASE OF POWER FAILURE

(75) Inventor: Tsuyoshi Kishino, Yamanashi (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/100,329

(22) Filed: Jun. 19, 1998

(30) Foreign Application Priority Data

Jun. 19, 1997 (JP) .................................................. 9-162863

(51) Int. Cl.⁷ ........................... G06F 12/16; G11C 11/406
(52) U.S. Cl. ........................... 711/106; 365/222; 711/167
(58) Field of Search ................................ 711/106, 105, 711/167; 365/222

(56) References Cited

U.S. PATENT DOCUMENTS

| 4,977,537 | 12/1990 | Dias et al. ........................... 711/106 |
| 5,365,487 | * 11/1994 | Patel et al. ........................... 365/222 |
| 5,590,082 | * 12/1996 | Abe ...................................... 365/222 |
| 5,594,699 | * 1/1997 | Nomura et al. ........................ 365/226 |
| 5,634,106 | 5/1997 | Yaezawa et al. ..................... 711/106 |
| 5,636,171 | * 6/1997 | Yoo et al. ............................. 365/222 |
| 5,640,357 | 6/1997 | Kakimi ................................ 365/229 |

FOREIGN PATENT DOCUMENTS

| 30 03 524 | 8/1980 | (DE) . |
| 3-237678 | 10/1991 | (JP) . |
| 6-208503 | 7/1994 | (JP) . |
| 7-334432 | 12/1995 | (JP) . |
| 97/17647 | 5/1997 | (WO) . |

* cited by examiner

*Primary Examiner*—Glenn Gossage

(57) ABSTRACT

A computer memory controller comprises a dynamic random access memory (DRAM) timing control section that provides, during memory back-up operation mode, self-refresh timing to a DRAM array having self-refresh function. The memory controller also comprises a refresh/back-up control section that provides information as to memory back-up state to the DRAM timing control section. A DRAM identification mode register is provided. When a DRAM array without a self-refresh function is mounted, the state of the register changes. The state of the register is fed to the DRAM timing control section, thereby to provide timing according to the conventional column address strobe (CAS) before row address strobe (RAS) or CBR refresh method to the DRAM array.

3 Claims, 5 Drawing Sheets

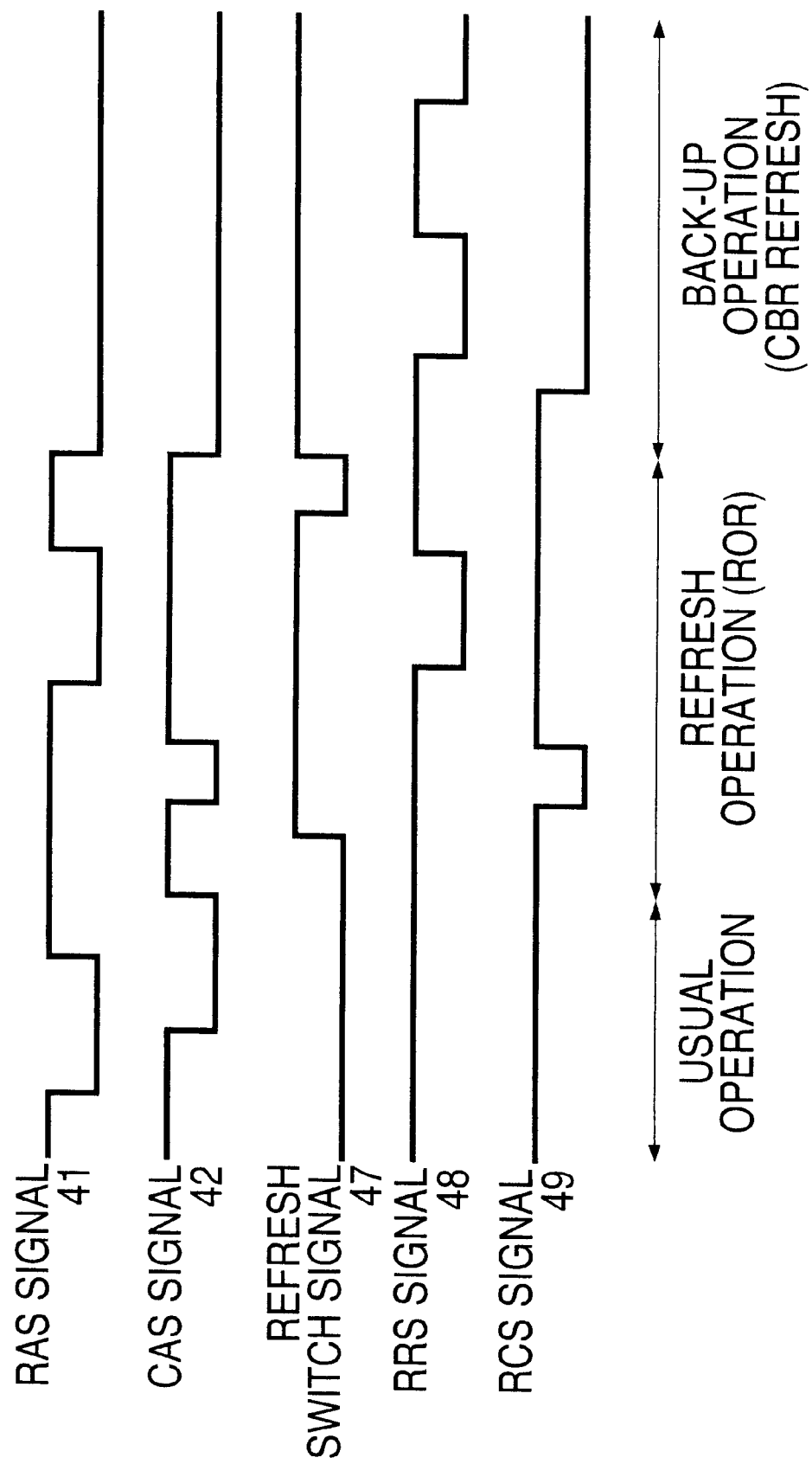

COMPUTER MEMORY CONTROLLER WITH SELF REFRESH PERFORMED DURING MEMORY BACK-UP OPERATION IN CASE OF POWER FAILURE

FIELD OF THE INVENTION

The present invention relates to a computer memory controller, and more particularly to a computer memory controller for a memory in the form of a dynamic random access memory structure that has a battery back-up function.

BACKGROUND OF THE INVENTION

Memories are widely well known which have a memory back-up function to maintain information using a battery in case of a power failure. If the memory is a DRAM, it is essential, in the memory back-up control, for the DRAM to a refresh operation.

Usually, a refresh operation of a DRAM may be performed according to a row address strobe (RAS) only refresh (ROR) method or a column address strobe (CAS) before RAS (CBR) method or a self-refresh method. However, the CBR method is usually employed in performing a refresh operation for memory back-up control in case of power failure. The ROR method may be used in performing a refresh operation for memory back-up control in case of power failure. However, this method requires setting of fresh addresses each time upon performing refresh operation. Further, the refresh addresses must be handed over during a shift from memory back-up operation to a usual or normal operation or vice versa causing increased complexity of memory back-up control. This explains why the ROR method has not been widely employed.

Conventionally, few computer memory controllers are designed to provide a self-refresh function of a DRAM operable to perform a refresh operation when a memory back-up operation is needed. This is because DRAMs with a self-refresh function are not yet popular in the market and thus the number of such DRAMs is very small.

Accordingly, it is the conventional practice to use the CBR method in performing a refresh operation upon memory back-up operation using a battery as shown, for example, in JP-A 3-237678, which is illustrated in FIG. 4. In FIG. 4, the reference numeral 44 indicates a clock generator, which generates a refresh RAS signal (RRS signal) 48 and a refresh clock source signal (RFCK signal) 46. The reference numeral 45 indicates a refresh switch. A power failure signal (PF signal) 43 is used as an input to the refresh switch 45 for the refresh switch 45 to output a switch signal 47. The level of the PF signal 43 determines the level of the switch signal 47. RAS signal 41 and RFCK signal 46 are also used as inputs to the refresh switch 45, causing the refresh switch 45 to generate a refresh CAS signal (RCS signal) 49. The reference numerals 4A and 4B designate a RAS selector and a CAS selector, respectively. RAS signal 41 and RRS signal 48 are used as inputs to the RAS selector 4A. CAS signal 42 and RCS signal 49 are used as inputs to the CAS selector 4B. In response to the refresh switch signal 47, the RAS selector 4A selects one of its inputs for output to a DRAM 4C, and the CAS selector 4B selects one of its inputs for output to the DRAM 4C. This accomplishes a refresh operation mode necessary for assuring contents stored in the memory are maintained.

The timing chart of FIG. 5 illustrates operation of the conventional example shown in FIG. 4. During usual operation mode, RAS signal 41 and CAS signal 42 are fed to DRAM 4C. As illustrated in FIG. 5, the ROR method is used for refresh operation during normal operation mode, while the CBR method is used for refresh operation during back-up operation.

According to the conventional computer controller, the CBR method, which is employed for refresh operation during back-up mode operation, consumes a great amount of electricity out of a limited amount of electric power battery supply. Thus, the time period that the memory can be backed up is reduced. This is because the power consumption by DRAM during refresh operation according to a CBR method is as great as that during a usual operation.

To remedy this problem, it may be an alternative to employ a self-refresh operation of DRAM by redesigning a computer memory controller. However, the computer memory controller as redesigned poses a potential problem that it cannot provide a memory back-up function when a DRAM without a self-refresh function is installed. As mentioned before, the number of DRAMs with self-refresh function is limited in the market and most of the DRAMs available in the market are not provided with a self-refresh function, which requires a CBR method for refresh operation.

An object of the present invention is to provide a computer memory controller, which is operable to reduce power consumption during memory back-up operation within a DRAM having memory back-up function.

A further object of the present invention is to provide a computer memory controller, which is operable to select a refresh operation during a memory back-up mode in the case that DRAM is installed that is not provided with a special refresh function, such as a self-refresh function, needed for reducing power consumption.

SUMMARY OF THE INVENTION

A computer memory controller according to the present invention is intended for a memory in the form of a DRAM having a memory back-up function in case of power failure. The computer memory controller is operable to perform refresh operation, during memory back-up operation mode, in accordance with a self-refresh method.

Specifically, the computer memory controller comprises a DRAM timing control section, which generates a timing signal suitable for a self-refresh function of a DRAM and provides the timing signal to the DRAM, and a back-up control section, which detects a memory back-up state and outputs the detected result to the DRAM timing control section. The computer memory controller also comprises a DRAM identification (ID) mode register, which can identify the fact that a DRAM without a self-refresh function is in use. The DRAM timing control section is operable in response to the state of the mode register to provide a refresh operation suitable for the DRAM that is in use.

BRIEF DESCRIPTION OF THE DRAWINGS

FIG. 5 shows a timing chart of signals within the controller of FIG. 4.

DESCRIPTION OF THE PREFERRED EMBODIMENTS

Figure 1:
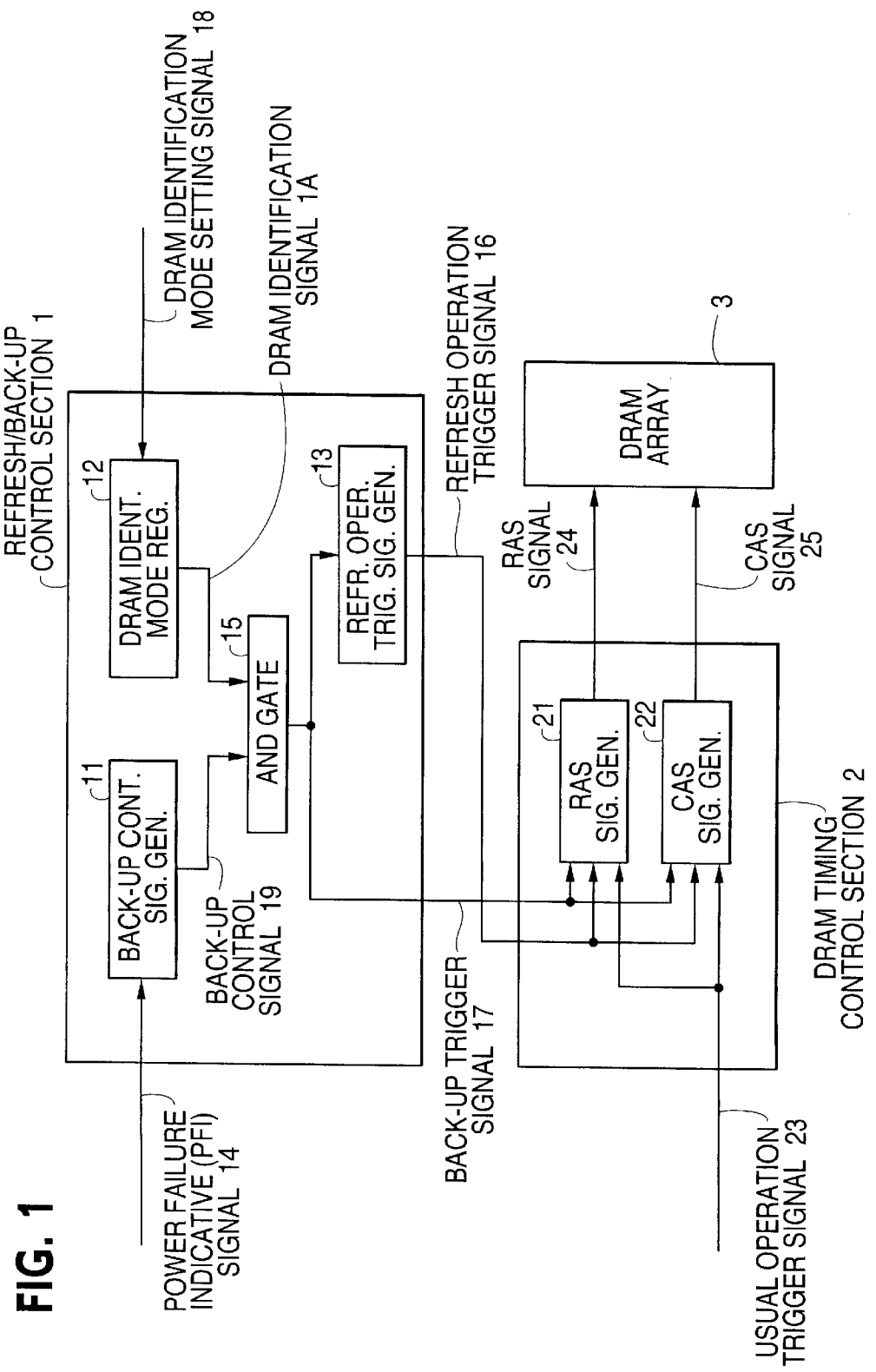
FIG. 1 shows a block diagram of a controller as configured in the preferred embodiment.
Figure 2:
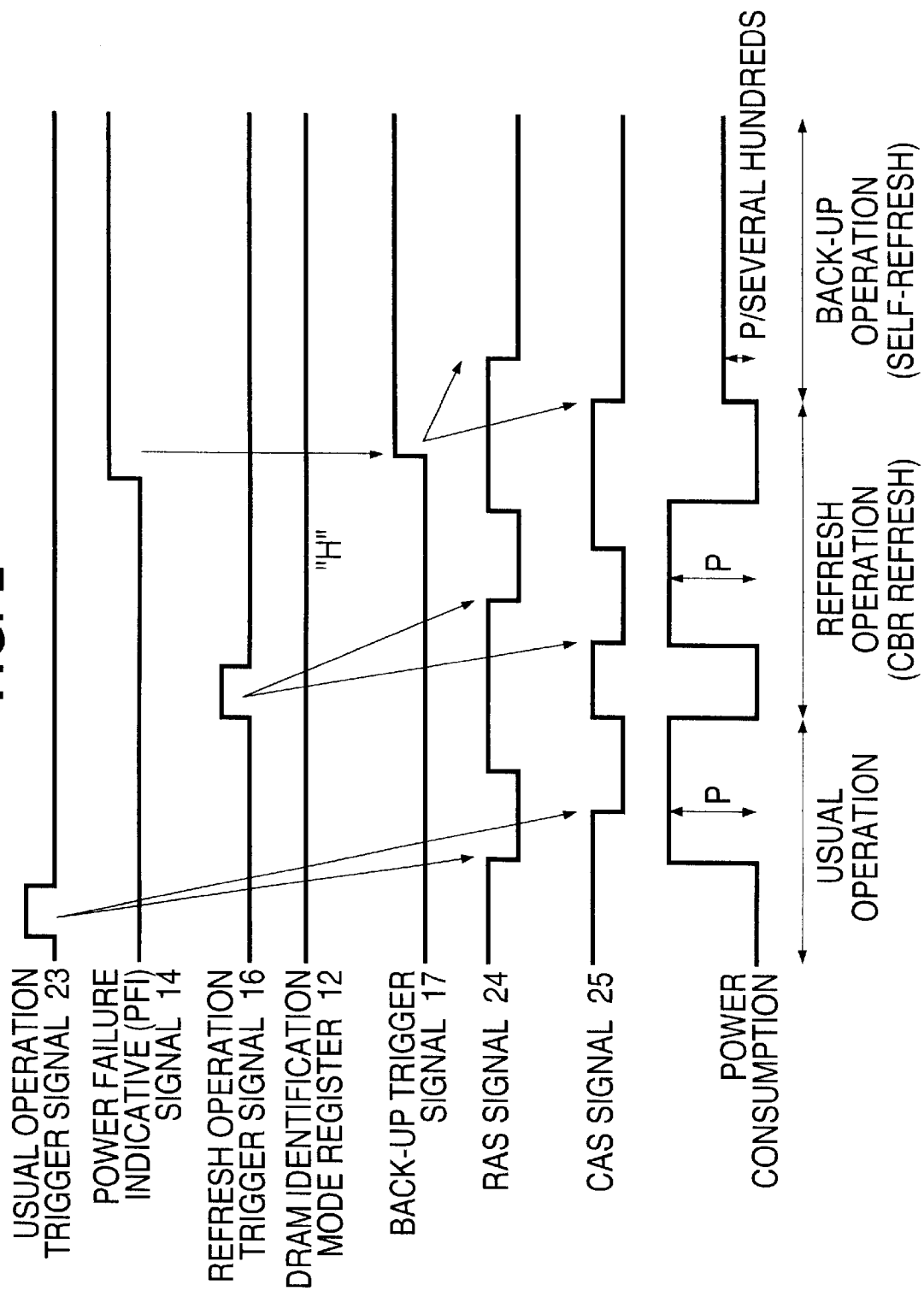
FIG. 2 shows a timing chart of signals within the controller for DRAMs with a self-refresh function.
Figure 3:
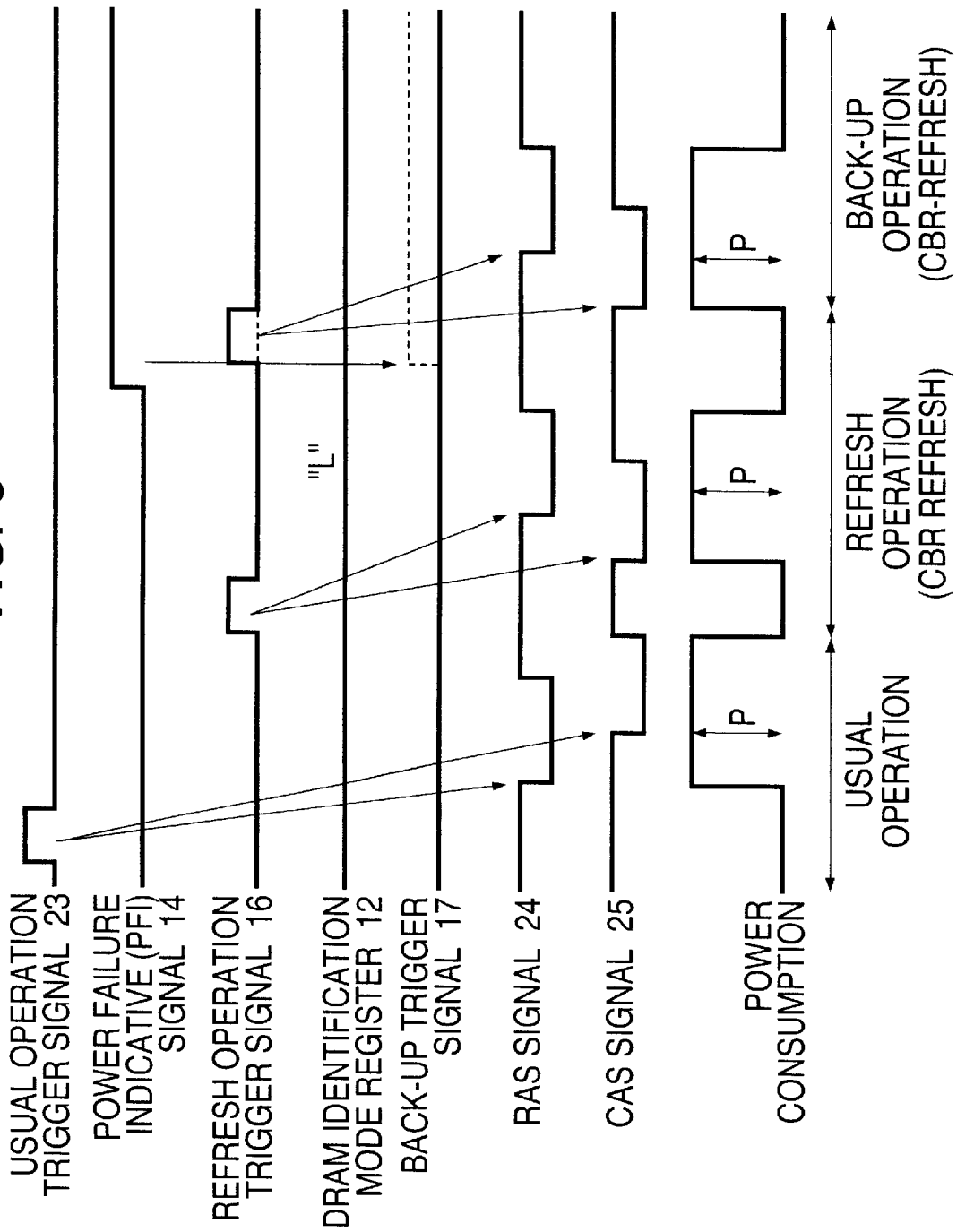
FIG. 3 shows a timing chart of signals within the controller for DRAMs without a self-refresh function.
Figure 4:
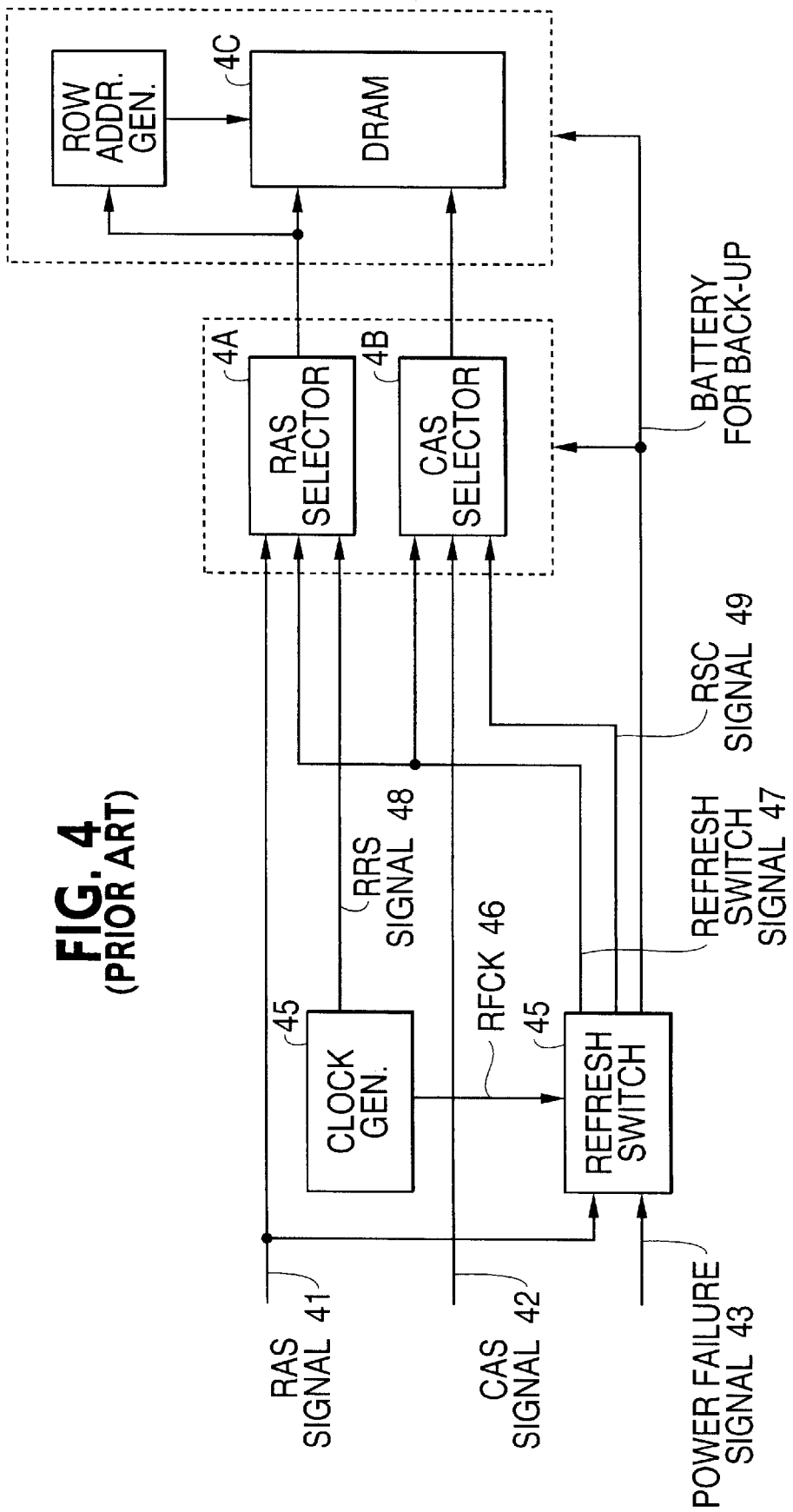
FIG. 4 shows a block diagram of a controller as configured according to the prior art.

Referring to FIGS. 1 to 3, the preferred embodiment of the controller according to the present invention is described.

In the block diagram shown in FIG. 1, a power-fail indicative (PFI) signal 14 and a DRAM identification mode setting (DIMS) signal 18 are used as inputs to a refresh/back-up control section 1. The refresh/back-up control section 1 generates a refresh operation trigger (ROT) signal 16 and a back-up trigger (BT) signal 17. ROT signal 16, BT signal 17, and usual operation trigger (UOT) signal 23 are used, as Inputs, to a DRAM timing control section 2. The DRAM timing control section 2 generates a RAS signal 24 and a CAS signal 25. RAS signal 24 and CAS signal 25 are used as inputs to a dynamic random access memory (DRAM) array 3.

The DRAM timing control section 2 receives ROT signal 16 or BT signal 17 from the refresh/back-up control section 1, and UOT signal 23 from a memory control section, not shown. In response to levels of these signals, the DRAM timing control section 2 selects an appropriate one of timings that are predetermined for a memory write-in/read-out operation, a CBR function, and a self-refresh function, respectively, and generates RAS signal 24 and CAS signal 25 at the selected timing.

The refresh/back-up control section 1 includes a back-up control signal generator 11, a DRAM identification mode register 12, an AND gate 15, and a refresh operation trigger signal generator 13. The back-up control signal generator 11 receives PFI signal 14 and outputs back-up control (BC) signal 19 in response to the PFI signal 14. The DRAM identification mode register 12 receives DIMS signal 18 and outputs DRAM identification (DI) signal 1A in response to the DIMS signal 18. The BC signal 19 and DI signal 1A are used as inputs of the AND gate 15, respectively. The AND gate 15 performs a logical product (AND) of the two inputs and outputs BT signal 17. The refresh operation trigger signal generator 13 receives BT signal 17 and outputs ROT signal 16 in response to BT signal 17.

Suppose that the state level of (PFI) signal 14 indicates power fault, and the DRAM array 3 has a self-refresh function. In this case, the back-up control signal generator 11 generates BC signal 19, and the DRAM identification mode register 12 sets the DI signal 1A to a level indicative of the fact that the DRAM array 3 has a self-refresh function. This causes the AND gate 15 to apply, as the output, BT signal 17 to the DRAM timing control section 2. In response to the BT signal 17, the DRAM timing control section 2 outputs a timing signal that corresponds to the self-refresh function of the DRAM, putting the self-refresh function into memory back-up operation. The BC signal 19 is fed also to the refresh operation trigger signal generator 13, causing the generator 13 to stop producing the ROT signal 16.

Let us next consider the case that the state level of (PFI) signal 14 indicates power fault, but the DRAM array 3 has no self-refresh function. In this case, the DI signal 1A is set to a level indicative of the fact that the DRAM array 3 has no self-refresh function. This causes the AND gate 15 to stop producing the BT signal 17, causing the refresh operation trigger signal generator 13 to produce the ROT signal 16. This results in realizing the memory back-up operation using CBR.

The operation is further described in connection with the timing charts of FIGS. 2 and 3.

The timing chart of FIG. 2 illustrates the case where a DRAM array 3 with self-refresh function is used. In this timing chart, usual memory access operation, refresh operation by CBR, and memory back-up operation by self-refresh function happen in this order.

Suppose that the DRAM identification mode register 12 contains a logical high "H" level, which is indicative of the fact that the DRAM array 3 has self-refresh function, and PFI signal has a logical low "L" level, which is indicative of the fact that the power supply is normal. The DRAM identification mode register 12 was set to the "H" level via DIMS signal 18. In this case, the usual memory access operation is performed. The DRAM timing control section 2 receives UOT signal 23, which is sent by the memory control section (not shown). The UOT signal 23 is used as an input to RAS signal generator 21 and also as an input to CAS signal generator 22, causing the generators 21 and 22 to output RAS signal 24 and CAS signal 25, each of which corresponds to a normal memory access. The RAS signal 24 and CAS signal 25 are fed to DRAM array 3.

Subsequently, at a moment when a refresh operation is requested during a usual operation, the DRAM timing control section 2 receives ROT signal 16 from the refresh operation trigger signal generator 13 within the refresh/back-up control section 1. The ROT signal 16 appears at regular interval. It is used as an input to the RAS signal generator 21, and also as an input to the CAS signal generator 22, causing the generators 21 and 22 to output RAS signal 24 and CAS signal 25, each of which corresponds to CBR. The RAS signal 24 and CAS signal 25 are fed to DRAM array 3.

Lastly, at a moment when a power fault happens, the (PFI) signal 14 shifts to a logical high "H" level, causing the back-up control signal generator 11 within the refresh/back-up control section 1 to generate BC signal 19, which has a logical high "H" level. Since the "H" level DI signal 1A and the "H" level BC signal 19 are impressed onto the inputs, the AND gate 15 provides as its output a signal having a logical high "H" level. This output of the AND gate 15 is fed, as BT signal 17, to the refresh operation trigger signal generator 13 and also to the DRAM timing control section 2. Impressing the BT signal 17 onto the refresh operation trigger signal generator 13 causes the generator 13 to stop generating ROT signal, which appeared at regular intervals. When the DRAM timing control section 2, the BT signal 17 is used as an input to the RAS signal generator 21 and also as an input to the CAS signal generator 22. This causes the generators 21 and 22 to output RAS signal 24 and CAS signal 25, each of which corresponds to the self-refresh. The RAS signal 24 and CAS signal 25 are fed to DRAM array 3.

With regards to power consumption by the DRAM array 3 during the above-discussed three operation modes, the power consumption during the self-refresh operation mode drops down to P/several hundreds (P/several 100s), if the power consumption during usual memory access operation mode is P. The power consumption during CBR operation mode is P. It is now possible to considerably lower the power consumption during memory back-up operation.

The timing chart of FIG. 3 illustrates the case where the DRAM array 3 does not have self-refresh function. In this timing chart, usual memory access operation, refresh operation by CBR, and memory back-up operation happen in this order.

The usual memory access and refresh operations in this timing chart are the same as those in the timing chart of FIG. 2. Thus, detailed description thereof is hereby omitted for sake of brevity.

The timing chart of FIG. 3 is different from that of FIG. 2 only in the refresh operation for memory back-up operation. The DRAM identification mode register 12 contains a logical low "L" level, which is indicative of the fact that the DRAM array 3 does not have self-refresh function.

Referring to FIG. 3, at a moment when a power fault happens, the (PFI) signal 14 shifts to a logical high "H"

level, causing the back-up control signal generator 11 within the refresh/back-up control section 1 to generate BC signal 19, which has a logical high "H" level. As different from FIG. 2, the "L" level DI signal 1A is impressed onto one of the inputs, and thus the AND gate 15 provides as its output a signal having a logical low "L" level irrespective of the logical level impressed onto the other input. Thus, BT signal 17 has a logical low L level, and the refresh operation trigger signal generator 13 continues to output ROT signal 16 at regular intervals. Thus, even during memory back-up operation, the DRAM timing control section 2 continues to output RAS signal 24 and CAS signal 25, each of which corresponds to the CBR refresh. The RAS signal 24 and CAS signal 25 are fed to DRAM array 3. The power consumption by the DRAM array 3 during this operation remains the same and is equal to P.

What is claimed is:

1. A computer memory controller for a memory in the form of a DRAM having a memory back-up function in case of power failure, the computer memory controller operable to cause the DRAM to perform self refresh operations during the memory back-up operation, the controller comprising:

a back-up control section comprising:

a back-up control signal generator outputting a back-up control signal in response to a power failure indicative (PFI) signal;

a DRAM identification mode register that detects whether a DRAM without a self-refresh function is in use and outputs a DRAM identification signal accordingly, the back-up control section providing a back-up trigger signal according to the logical combination of the back-up control signal and the DRAM identification signal; and a refresh trigger signal generator that receives the back-up trigger signal and outputs a refresh operation trigger signal accordingly; and a DRAM timing control section that receives as inputs the refresh operation trigger signal and the back-up trigger signal and, during memory back-up operation mode, outputs a self-refresh timing signal to the DRAM when the DRAM is detected as having a self-refresh function and outputs a refresh timing signal other than a self-refresh timing signal when the DRAM is detected as not having a self-refresh function.

2. The computer memory controller as claimed in claim 1, further comprising:

a logical gate that receives as its inputs the back-up control signal and the DRAM identification signal, logically combines the back-up control signal and the DRAM identification signal, and provides the back-up trigger signal accordingly.

3. The computer memory controller as claimed in claim 1, wherein when the controller is not in memory back-up operation, the refresh trigger signal generator does not provide a refresh trigger signal to the DRAM timing control section.

* * * * *